(12) United States Patent
Drobny et al.

(10) Patent No.: US 10,050,157 B2
(45) Date of Patent: Aug. 14, 2018

(54) SPIKE IMPLANTED SCHOTTKY DIODE

(75) Inventors: Vladimir F. Drobny, Tucson, AZ (US); Derek W. Robinson, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 711 days.

(21) Appl. No.: 11/173,695

(22) Filed: Jul. 1, 2005

(65) Prior Publication Data

US 2007/0001256 A1 Jan. 4, 2007

(51) Int. Cl.
*H01L 21/28* (2006.01)
*H01L 29/872* (2006.01)
*H01L 29/66* (2006.01)

(52) U.S. Cl.
CPC ...... *H01L 29/872* (2013.01); *H01L 29/66143* (2013.01)

(58) Field of Classification Search
CPC ................ H01L 29/872; H01L 29/66143
USPC ........... 257/475, E21.359, E29.338; 438/570
See application file for complete search history.

(56) References Cited

U.S. PATENT DOCUMENTS

| | | | | | |
|---|---|---|---|---|---|
| 4,357,178 | A | * | 11/1982 | Bergeron et al. | 438/534 |
| 5,150,177 | A | * | 9/1992 | Robinson et al. | 257/370 |
| 6,492,192 | B1 | * | 12/2002 | O'Toole et al. | 438/57 |
| 2007/0001193 | A1 | * | 1/2007 | Drobny et al. | 257/107 |

OTHER PUBLICATIONS

Nunes et al., ""No cost" reduced-leakage Schottky diode by ion implantation", Sep. 8, 1999, Advanced Semiconductor Manufacturing Conference and Workshop, 1999 IEEE/SEMI, 1999, pp. 172-177).*

* cited by examiner

*Primary Examiner* — Hsin-Yi Hsieh
(74) *Attorney, Agent, or Firm* — Jacqueline J. Garner; Charles A. Brill; Frank D. Cimino (57) ABSTRACT

A rectifying diode. The diode comprises a first conductor region and a second conductor region. The diode further comprises a diode conductive path between the first conductor region and the second conductor region. The path comprises a first semiconductor volume having a non-uniform distribution of ions and a second semiconductor volume having a uniform distribution of ions relative to the first semiconductor volume.

14 Claims, 4 Drawing Sheets

SPIKE IMPLANTED SCHOTTKY DIODE

CROSS-REFERENCES TO RELATED APPLICATION

This application is related to U.S. Patent application Ser. No. 11/174,190 entitled "Schottky Diode With Minimal Vertical Current Flow," filed Jul. 1, 2005, and hereby incorporated herein by reference.

STATEMENT REGARDING FEDERALLY SPONSORED RESEARCH OR DEVELOPMENT

Not Applicable.

BACKGROUND OF THE INVENTION

The present embodiments relate to semiconductor circuits and are more particularly directed to a Schottky diode formed in part with a spike implant.

Semiconductor devices are prevalent in all aspects of electronic circuits, and various materials are used in the creation of such devices. For example, deep sub-micron technology (e.g., gate width of 0.5 micron or less) uses metal silicide, that is, a metal reacted with silicon, for various devices. For example, silicide ohmic contacts are used to reduce gate and source and drain contact resistance. As other examples, silcides may be used in connection with polysilicon resistors and capacitors. In the method steps of forming such devices (the "method flow"), therefore, often a particular metal is selected to form these silcides. In a common application, a metal such as titanium (Ti), cobalt (Co), nickel (Ni), or molybdenum (Mo) may be so chosen, thereby forming a respective silicide of $TiSi_2$, $CoSi_2$, $NiSi$, or $MoSi$.

While the above-discussed metals prove workable in various applications, they may not be optimal in connection with the formation of a particular and known semiconductor circuit element, the Schottky diode. A Schottky diode typically includes a metal to lightly-doped semiconductor interface, where this interface is known to have rectifying characteristics. Thus, for this interface, an appropriate metal should be selected. However, the metal selection contributes to the barrier height of the diode, and that barrier height may be critical for certain applications. Particularly, the above-introduced common metals of Ti, Co, Ni, and alternative metals of Pt and Pd typically provide a medium (Ti) or higher (Co, Ni) or very high barrier height (PtSi $Pd_2Si$) Schottky diode on N-type doped silicon. Thus, in a method flow where a very low low barrier height Schottky diode is desired, while one of the common metals of Ti, Co, and Ni may be used with other devices formed as part of the same overall method flow, an alternative metal may be required to form the Schottky diode so as to provide the desired barrier height. Such alternative metals include, by ways of example, platinum (Pt) and palladium (Pd), which therefore form a respective silicide of PtSi or $Pd_2Si$ on P-type doped silicon for very low barrier height diodes or on N-type doped silicon for very high barrier height Schottky diodes.

By way of further background, various applications now require or benefit from the use of low barrier height Schottky diodes. For example, one such application is the implementation of radio frequency identification ("RFID") passive tag devices. An RFID device, as known in that art, is a device that receives a radio frequency ("RF") signal and provides a corresponding current in response to that signal. In some applications, the RFID device will receive a relatively small RF signal and, hence, in these applications a low-barrier Schottky diode is desirable so as to detect the small RF signal.

Given the preceding, one manner according to the prior art of creating a low barrier height Schottky diode for an application, such as RFID, is to use a P type material at the metal/semiconductor interface. However, if additional barrier lowering is needed, then two different silicides may be included in the method flow of the entire semiconductor structure, with a certain metal (e.g., Ti, Co, Ni) used for devices other than the Schottky diode(s) and a different metal (e.g., Pt, Pa) used for the low barrier Schottky diode(s). However, such an approach is very costly and, thus, may be undesirable or unacceptable.

Thus, there arises a need to address the drawbacks of the prior art, as is achieved by the preferred embodiments described below.

BRIEF SUMMARY OF THE INVENTION

In the preferred embodiment, there is a rectifying diode. The diode comprises a first conductor region and a second conductor region. The diode further comprises a diode conductive path between the first conductor region and the second conductor region. The path comprises a first semiconductor volume having a non-uniform distribution of ions and a second semiconductor volume having a uniform distribution of ions relative to the first semiconductor volume.

Other aspects are also disclosed and claimed.

DETAILED DESCRIPTION OF THE INVENTION

Figure 1A:
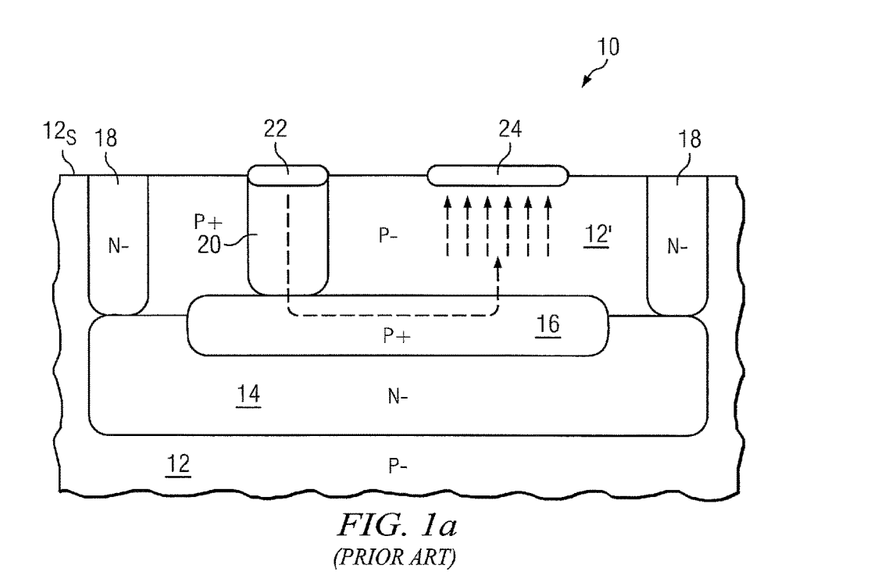
FIG. 1a illustrates a cross-sectional view of a diode according to the preferred embodiment.

FIG. 1a illustrates a cross-sectional diagram of a semiconductor Schottky diode 10. At the outset, note that the items as depicted in general form in FIG. 1a appear in both a preferred embodiment and in the prior art. However, as detailed later, the preferred embodiments include different manners of doping the diode conductive path in an inventive manner and improving diode 10 as compared to the prior art, rendering it usable with certain metals in applications not suitable for alternative metals that are used in the prior art.

Various preferred details in this regard are discussed later in connection with FIG. 1b, where first an introduction to the general structure of diode 10 and its operation are described.

Diode 10 is formed in connection with a semiconductor substrate 12, which in the example of FIG. 1a is a P type semiconductor material and that is lightly-doped, as shown by the conventional designation of "P−" in FIG. 1a for such type and level of doping. A light doping preferably has a doping profile concentration on the order of $10^{16}/cm^3$ or less. A region of N type material is formed such as an N well 14 so that a portion of substrate 12 is below N well 14, where N well 14 is lightly-doped as shown by the conventional designation of "N−" in FIG. 1a for such type and level of doping. Note that N well 14 may be formed using various different method flows relative to substrate 12. In one example, N well 14 is formed generally above or as part of the top portion of substrate 12, with other structures formed as part of N well 14 and additional layers over it. However, with certain and generally newer technologies, N well 14 may be formed through an upper surface $12_s$ of substrate 12, such as by using a high energy implant that is able to penetrate surface $12_s$ and form N well 14 as a buried layer deeper than that surface so that some unaffected material, which in the illustrated example is a portion 12' of substrate 12, is also above N well 14.

A buried layer 16 is formed as part of or above N well 14, where buried layer 16 is P type and heavily-doped as shown by the conventional designation of "P+" in FIG. 1a for such type and level of doping. A heavy doping preferably has a doping profile concentration on the order of $10^{19}$ to $10^{21}/cm^3$ or greater. Note that the descriptor "buried layer" is just one of various terms used in the art, so as to describe a portion of semiconductor material that is beneath the surface of an overlying layer; thus, in the example of FIG. 1a, buried layer 16 is beneath surface $12_s$ of the overlying portion 12' of substrate 12. As was the case for N well 14, buried layer 16 may be formed in various fashions, such as by forming it in substrate 12 prior to forming an overlying layer 12' or, alternatively, by using a high energy implantation process that is able to penetrate surface $12_s$ and form the layer deeper than that surface so that some unaffected material (e.g., portion 12') is left above the buried layer implant and without the dopant concentration of the buried layer.

Isolating regions 18 are formed from surface $12_s$ down to, and of the same conductivity type as, N well 14, and a heavily-doped type conductive region 20 is formed from surface $12_s$ down to, and of the same conductivity type as, buried layer 16. Thus, in the illustrated example, isolating regions 18 are N type and heavily-doped conductive region 20 is P type. Further, region 20 also may be referred to by various terms such as a sinker and, thus, hereinafter this region is referred to as sinker 20. Region 18 and sinker 20 are formed with different implant steps due to their differing conductivity types, and note that for each a single implant may be used, or so-called chain implants may be used whereby successive implants at different energies and doses are performed so as to form portions of each region at different depths until the desired target (i.e., either N well 14 or buried layer 16) is reached.

Completing the discussion of the structural components shown in FIG. 1a, diode 10 includes two metal-silicide regions 22 and 24. Metal-silicide region 22 is formed over and in contact with sinker 20, and metal-silicide region 24 is formed along surface $12_s$. According to the preferred embodiment, the metal used to form these silicide regions 22 and 24 may be one of various metals, but for advantageous reasons concluded later, preferably such metals are one of titanium (Ti), cobalt (Co), nickel (Ni), or molybdenum (Mo). While such metals are found in various prior art devices, note that they may be used in the preferred embodiment while achieving a lower barrier height and, hence, a greater current density and power capability, as compared to prior art diodes for reasons explored in greater detail later. Lastly, note that diode 10 may include other regions or portions, but they are not illustrated so as to simplify the illustration while permitting a focus on various noteworthy aspects.

The operability of diode 10 is now discussed. As introduced earlier, a metal to lightly-doped semiconductor interface provides rectifying characteristics; thus, in diode 10, the interface of metal-silicide region 24 to P-type portion 12' creates such characteristics. In operation, this interface performs akin to an NP junction, so a negative bias may be applied to metal-silicide region 24 and a positive bias may be applied to metal-silicide region 22. With this forward bias, current flows from the conductor metal-silcide region 22 as an ohmic contact to sinker 20, then to and through buried layer 16, through portion 12', and finally to the conductor metal-silicide region 24. This current flow through the diode's conductive path is shown in FIG. 1a by dashed arrows. Also in this regard, therefore, metal-silicide region 22 operates as the diode anode, providing the location of inward current flow, while metal-silicide region 24 operates as the diode. cathode, providing the location to which current flows.

Figure 1B:
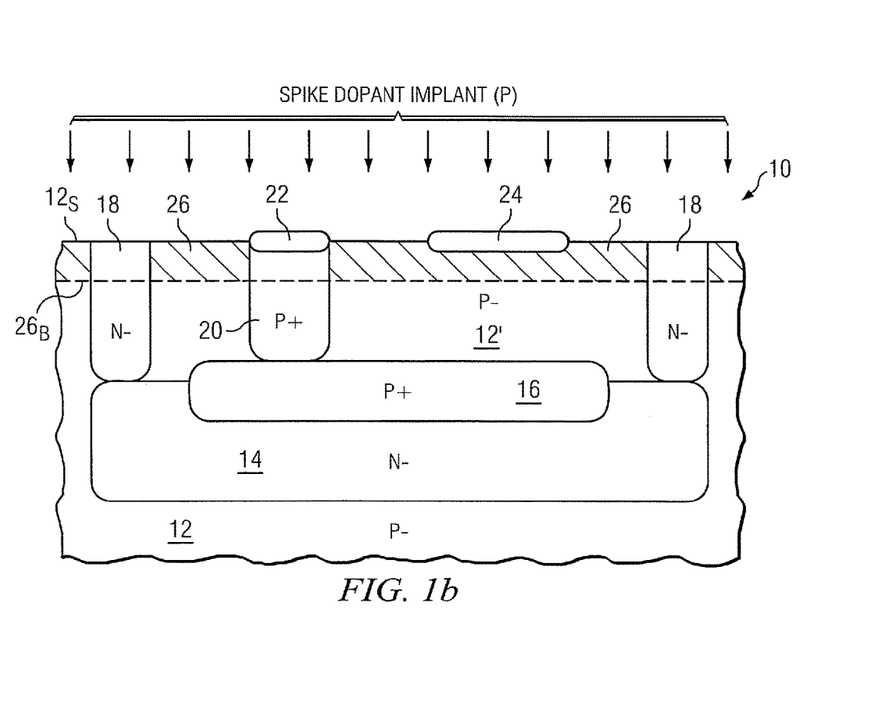
FIG. 1b illustrates the cross-sectional view of the diode of FIG. 1a and with a novel spike implant fabrication step.

FIG. 1b illustrates the cross-sectional view of diode 10 of FIG. 1a, but further illustrates a novel fabrication step that is now described and with its effect explored throughout the remainder of this document. Specifically, in FIG. 1b, a spike dopant implant is performed relative to substrate 12 and its portion 12'. The phrase spike dopant implant (or similar such terminology) is known in the art because it creates a volume of ions that has a relative change in concentration with depth in the volume, that is, there is a non-uniform distribution of the dopant ions in the resulting volume and the change in distribution preferably reduces with depth. To illustrate this aspect and in cross-sectional form, in FIG. 1b the cross-section of this volume is shown as a shallow surface implant region 26 using patterned dots and starting at surface $12_s$ of substrate and extending inward (or downward in the illustrated perspective) into substrate 12 (or, where indicated, in portion 12'). Region 26 includes a non-uniform spiked dopant concentration profile having a considerably higher dopant concentration near surface $12_s$ than at its lower depth opposite border $26_B$ (shown by a dashed line in FIG. 1b), as further detailed below.

Figure 2:
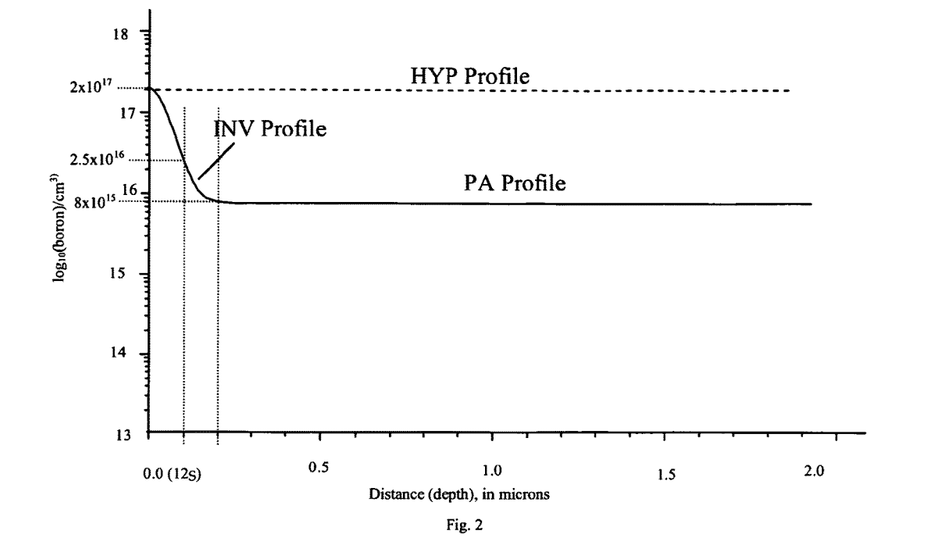
FIG. 2 illustrates a plot of the dopant concentration in the substrate of the diode of FIG. 1b starting from the surface of that substrate.

In the preferred embodiment, the dopant concentration near surface $12_s$ within spike region 26 may be on the order of ten to twenty, or more, times greater than that at border $26_B$. To illustrate this aspect in more detail, FIG. 2 illustrates a plot of the p-type (e.g., boron) dopant concentration in substrate 12, starting at a distance (or depth) of 0 microns relative to surface $12_s$, which thereby corresponds to the actual surface $12_s$. As seen in the example plot, at surface $12_s$, the p-type dopant concentration is approximately $2 \times 10^{17}/cm^3$. At 0.1 microns into, or down from, surface $12_s$, the p-type dopant concentration is reduced to $2.5 \times 10^{16}/cm^3$, a reduction of an approximate factor of eight relative to that at surface $12_s$. Further, at 0.2 microns into, or down from, surface $12_s$, the p-type dopant concentration is reduced to and flattens off at $8 \times 10^{15}/cm^3$, a reduction of an approximate factor of twenty-five relative to that at surface $12_s$. Thus, the depth of 0.2 microns into substrate 12 represents the border, $26_B$, of region 26. Thus, the volume of semiconductor material between two fixed distances, shown by example as border $26_B$ and surface $12_s$, includes a non-uniform distribution of ions. Moreover, to achieve this non-uniform distribution of dopant concentration in spike region 26 of FIG. 1b and of a form comparable to that plotted in FIG. 2, the spike dopant implant may be performed using various process methods. For example, in the case of FIG. 1b, a rapid thermal process ("RTP") is performed whereby the appropriate (e.g., boron) ions are implanted and then heated for 15 seconds to one minute at a temperature of 850° C. to 1000° C. This relatively short RTP is sometimes referred to as a low Dt (diffusion times time) process where the ions are primarily activated by the short heat burst rather than conventional long batch furnace diffused cycle. Of course, for different materials and processes, these parameters may be modified by one skilled in the art so as to still achieve a desirable dopant concentration gradient in a spike region 26 with respect to a preferred diode 10.

Continuing with the plot of FIG. 2, also in the preferred embodiments spike region 26 ends after a certain depth into substrate 12, and as represented by border $26_B$. At depths below that point, such as 0.2 microns as shown in the example of FIG. 2, the dopant concentration remains level at a relatively flat profile. Thus, in the example of FIGS. 1b and 2, below a fixed distance relative to surface $12_s$, where this distance is shown by border $26_B$, there is a volume of semiconductor that includes a distribution of ions that is relatively uniform as compared to the other volume between surface $12_s$ and border $26_B$. In the example illustrated, the dopant concentration in this volume is $8 \times 10^{15}/cm^3$. In other words, this latter concentration is merely that of the P– concentration of substrate 12, as it also exists in portion 12'. Note also that a flat profile, as known in the art, may not be perfectly flat and, indeed, may include some mild fluctuations such as a range on the order of two to three times as between peaks and valleys of the flat profile, although such peaks and valleys are not shown in FIG. 2 so as to simplify the illustration.

Another aspect that may be varied so as to create different preferred embodiments relates to when the spike implant is performed with respect to the timing of the formation of the other structures of diode 10. For example, in FIG. 1b the spike implant is shown to be performed after much of the diode structures are formed, including the anode, cathode, and semiconductor regions between them. Such an approach may be desirable for various reasons. As one example and while not shown, the formation of diode 10 is often performed using method flow steps that are already in place to construct other devices relative to substrate 12, where such other devices often include transistors. Indeed, due to the dominance of transistors in many designs, circuit method flows are often developed with a view toward constructing the transistors. However, other circuit elements, including diode 10, are preferably implemented as part of the same steps as the transistor method flow. Thus, in the example of FIG. 1b, a spike implant may already be included in the method flow so as to adjust the threshold voltage or form an LDD diffusion of such transistors, for example by providing a spike implant with respect to the channels of those transistors. In this case, then preferably that same spike implant is used with respect to diode 10 (and any other like diodes being formed). As another consideration, the approach of FIG. 1b provides the spike implant without the use of a device mask (e.g., without a photoresist process) during the spike implant. In other words, the dopant implant is a blanket implant across the entire device that is formed by substrate 12. In this manner, there is a considerable cost reduction due to the elimination of the need to construct another mask and to use another masking step in the method flow. Because the low to medium concentration dopant spike is shallow enough, and because the transistors are typically fully constructed at this point so as to no longer be open to such an implant, the spike has a negligible effect, if any, on other structures other than heavily doped contacts already formed with respect to substrate 12, while still achieving a beneficial impact on the operation of diode 10, as further detailed later. In an alternative embodiment, however, if a mask is used, then the spike implant may be applied to cause spike region 26 to exist only in selected locations; for example, if such a mask were used, spike region 26 may be formed only in the active region of the diode, or between isolating regions 18, or as yet another alternative spike region 26 may be formed solely in close proximity (e.g., three microns or less) of the device cathode, which recall in the example of FIG. 1b is silicide region 24. As yet another alternative preferred embodiment, the spike implant may be performed at other times relative to the times for forming other structures in diode 10. For example, the spike implant may be performed earlier in the device formation as compared to that shown in FIG. 1b, such as in connection with the formation of region 12' (e.g., if region 12' is created by a grown epitaxial layer, then once that layer is grown a spike implant may be performed into that layer). Such an approach, however, may require considerations of the fact that such earlier-implanted ions are likely to incur additional temperature cycles and thus higher Dt in connection with the formation of other structures relative to substrate 12. Such additional temperature cycles might desirably lower the series resistance of diode 10, thereby increasing the reverse bias current which may be a consideration for later use of the device.

Figure 3:
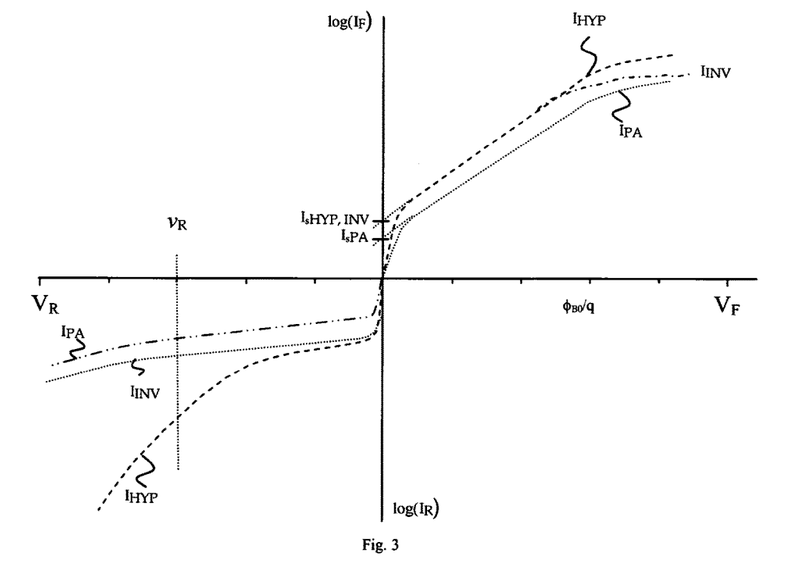
FIG. 3 illustrates three current plots $I_{HYP}$, $I_{PA}$, and $I_{INV}$ demonstrating the current through a hypothetical Schottky diode, a prior art Schottky diode, and the preferred embodiment inventive diode, respectively.

FIG. 3 illustrates three current plots $I_{HYP}$, $I_{PA}$, and $I_{INV}$ demonstrating per its vertical axis the drive current, I, through a hypothetical Schottky diode, a prior art Schottky diode, and the inventive diode 10, respectively, with respect to the voltage across each such diode per the horizontal axis, where the voltage may vary and may be, by way of example, in the range of a few tenths of a volt in the forward bias direction and a few volts in the reverse bias direction. Also shown for these three plots is the tangent of each curve for positive bias as the tangent intersects the vertical axis, thereby representing the value of Is for each such plot. Note that the plots of FIG. 3 are not drawn to precise scale or values, but instead are shown generally so as to compare various levels of the plots relative to one another. Plot $I_{HYP}$ represents a Schottky diode that hypothetically has a diode conductive region containing a uniform distribution of implanted ions as per the prior art, but at a relatively high concentration, as compared to the prior art, such as on the order of $10^{17}/cm^3$. Plot $I_{PA}$ represents a prior art Schottky diode wherein the entire diode conductive region has a uniform distribution of implanted ions, and at a concentration on the order of $10^{16}/cm^3$. Plot $I_{INV}$ represents the inventive diode 10 of the preferred embodiments. Various observations may be made with respect to the contrast of these three plots, while also thereby appreciating various improvements of diode 10 over the other plots.

Looking first to the range of positive voltages in FIG. 3, in general the plots of $I_{HYP}$ and $I_{INV}$ are shown to be the same in these positive ranges of voltages. Further, in the positive range of voltage, diode current $I_{HYP}$ and $I_{INV}$ exceed that of current $I_{PA}$. Accordingly, at first glance, the diode corresponding to plot $I_{HYP}$ might seem worthwhile for applications where higher $I_s$ (and the corresponding current density, $J_s$) is sought. However, looking now to the range of negative voltages as applied to the diodes represented by the plots in FIG. 3, note that the diode current $I_{HYP}$ has a considerable change in slope so that a large reverse bias current exists at a voltage $v_R$. In other words, while both $I_{HYP}$ and $I_{INV}$ may appear favorable for positive voltages, for $I_{HYP}$ there is a large trade-off at negative voltages due to the large magnitude leakage current at reverse voltages having larger magnitudes (e.g., greater than 1 volt). In contrast and also for negative voltages, the diode current $I_{INV}$ has a lesser slope than that of $I_{HYP}$, thereby representing a lesser amount of reverse bias current. Thus, the preferred embodiment diode, with its $I_s$ performance demonstrated via $I_{INV}$, results in a comparable range of $I_s$ for positive voltages to that of a diode with a flat profile doping concentration on the order of $10^{17}/cm^3$ (i.e., as shown by $I_{HYP}$), and for negative voltages the preferred embodiment diode provides a lesser amount of leakage current as compared to a Schottky barrier having a uniform concentration of dopants on the order of $10^{17}/cm^3$. Accordingly, the preferred embodiment is overall more favorable in various applications as compared to the diodes represented by either $I_{HYP}$ or $I_{P4}$. Moreover, such benefits are achieved in the preferred embodiment with various metals for silicide regions 22 and 24 that are used in standard transistor processes (e.g., Ti, Co, Ni) rather than necessitating the cost increases as would be required by adding a metal that differs from those metals.

Given the preceding, various observations may be made with respect to the preferred embodiment diode thus far described. Particularly, with respect to such a diode, it includes a rectifying interface that occurs between a metal and a lightly-doped semiconductor region of a given conductivity type (e.g., P type in FIGS. 1a and 1b). In addition, a spike region 26 is formed at a first fixed distance (e.g., 0.0 to 0.2 microns) relative to that interface (e.g., surface $12_s$). In the spike region 26, there is a non-uniform ion concentration. Further, adjacent the spike region 26 at and a second fixed distance, greater than the first and also relative to the interface, there is another region, which may be merely a portion of a semiconductor layer or substrate in which spike region 26 is formed, also of the given conductivity type. In the second region, there is a uniform ion concentration, relative to the non-uniform distribution of ions in spike region 26. The example of FIG. 2 illustrates a concentration range in the spike region 26 from $2 \times 10^{17}/cm^3$ to $8 \times 10^{15}/cm^3$, with a flat profile in the second region at $8 \times 10^{15}/cm^3$. Moreover, both of these regions combine to form parts of the conductive path of the diode. For example, returning to FIG. 1a, it may be seen that the current path includes current traveling in a generally vertical direction up from buried layer 16 toward metal-silidde region 24. Accordingly, the conductive path, through which such current flows, is through both of these first and second regions. Moreover, the beneficial effect of the two regions on such current flow has been shown in connection with FIG. 3. Lastly, note that while the illustrated example has particular dopant concentrations, these levels may be adjusted by one skilled in the art. For example in certain contemporary applications, the spike region 26 concentration may range such that its highest level of concentration in the non-uniform range is at any point as high as $5 \times 10^{17}/cm^3$ whereas its lowest level of concentration may be at some other point within the region as low as $5 \times 10^{16}/cm^3$. Generally adjustments to the height of the peak doping concentration in spike region can be used to achieve desired $I_s$ without significant effect on diode resistance $R_s$. In the region below spike region 26, that is, the region where dopant concentration is relatively uniform, at every point in that region the concentration is at a same or substantially the same value but that value in one embodiment could be as low as $5 \times 10^{15}/cm^3$ while in another embodiment it could be as high as $1 \times 10^{17}/cm^3$, and still in other embodiments that value could be, while remaining relatively uniform for a given embodiment, could be anywhere between those two limits. Generally adjustments to the concentration in flat region can be used to achieve desired $R_s$.

Figure 4:
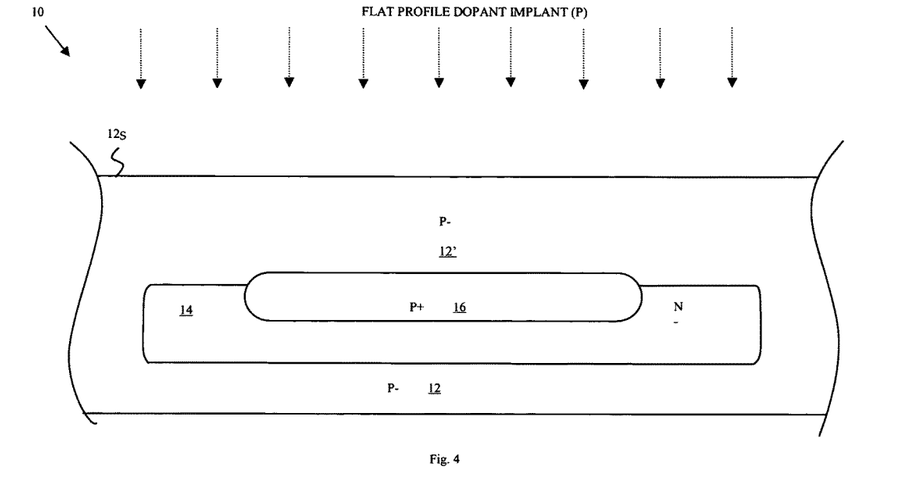
FIG. 4 illustrates the cross-sectional view of FIG. 1b but in an earlier stage of the method flow and in accordance with an alternative preferred embodiment that includes a second implant that is a flat profile implant.

FIG. 4 illustrates the cross-sectional view of FIG. 1b in an earlier stage of the method flow and in accordance with an alternative preferred embodiment, where in the alternative preferred embodiment another diode-related implant is performed in addition to the spike implant, as is now described. Specifically, in FIG. 4, again semiconductor substrate 12 is shown as are N well 14 and buried layer 16. In the alternative preferred embodiment, however, either after these structures are formed or in a different time of the method flow, a flat profile dopant implant or implants are performed. This additional implant increases the dopant concentration of at least the semiconductor volume, and that will be later formed, that has the uniform distribution of ions below what will become border $26_B$. In other words, by way of contrast recall with respect to FIGS. 1b and 2 that below border $26_B$ there is a uniform distribution of ions of approximately $8 \times 10^{15}/cm^3$; in contrast and as shown below, the additional flat-concentration implant of FIG. 4 will increase that concentration. Moreover, note that this additional implant also may affect the varying concentrations found in what will be the spike region 26 that is to be later formed. In any event, in this preferred alternative embodiment, by way of example, the implant/heat step in the FIG. 4 implant is performed so as to achieve a uniform ion distribution below what will be border $26_B$ at a concentration up to $1 \times 10^{17}/cm^3$. Such a distribution may be achieved by exposing substrate 12 to an implant with appropriate ion concentration followed by entire wafer anneal at a temperature of 900° C. or higher for approximately one or more hours.

Figure 5:
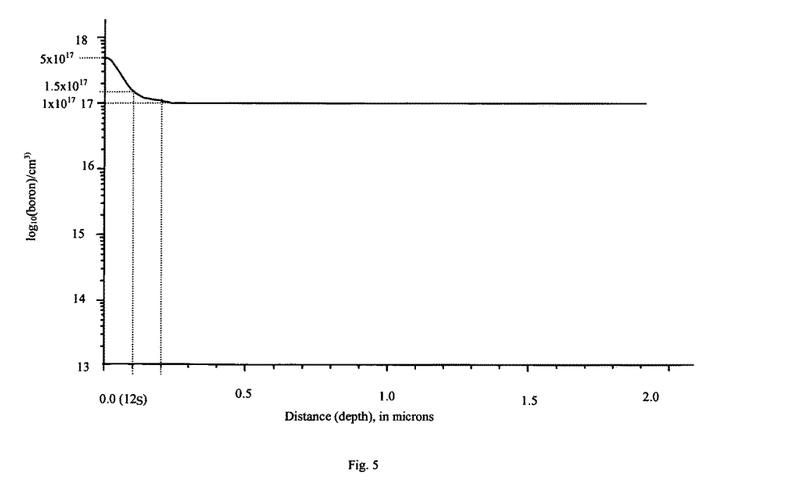
FIG. 5 illustrates a plot of the dopant concentration in the substrate of the diode of FIGS. 1a and 4.

Continuing with the alternative preferred embodiment introduced in connection with FIGS. 1b and 4, FIG. 5 illustrates a plot of the p-type dopant concentration in substrate 12 that may result from both a spike dopant implant step such as shown in FIG. 1b as well as a separate higher dose flat profile implant step as was shown in FIG. 4. Thus, in FIG. 5, at surface $12_s$, the p-type dopant concentration is approximately $5 \times 10^{17}/cm^3$. At 0.1 microns into, or down from, surface $12_s$, the p-type dopant concentration is reduced to $1.5 \times 10^{17}/cm^3$, a reduction of a factor of more than three relative to that at surface $12_s$. Further, at 0.2 microns into, or down from, surface $12_s$, the p-type dopant concentration is reduced to $1 \times 10^{17}/cm^3$, a reduction of five relative to that at surface $12_s$. At distances (or depths) greater than 0.2 microns, the plot represents a volume in portion 12' where the dopant concentration remains flat relative to that in the semiconductor volume at lesser depths, where in the example shown that concentration is approximately $1 \times 10^{17}/cm^3$. FIG. 5 demonstrates, therefore, that the alternative preferred embodiment diode, having been exposed to both spike and flat dopant implant steps, includes a volume such as shown in cross-section as region 26 in FIG. 1b, whereby for approximately the upper 0.2 microns of depth from surface $12_s$ there is a non-uniform distribution of the dopant ions. However, FIG. 5 also demonstrates that the alternative preferred embodiment diode, having been exposed also to a flat profile dopant implant, includes a volume (or region in cross-section) such as that below region 26 shown in FIG. 1b wherein there is a uniform distribution of the dopant ions.

Lastly, however, by comparing FIG. 5 to FIG. 2, it may be seen that the flat portion of the FIG. 5 plot is at a considerably higher concentration (i.e., $1 \times 10^{17}/cm^3$) than the flat portion of the FIG. 2 plot (i.e., $8 \times 10^{15}/cm^3$), due to the higher dose flat dopant implant discussed in connection with FIG. 4.

The present inventors have determined that the above-described alternative preferred embodiment, that is formed with both a spike implant and a higher-concentration flat profile implant, may provide various benefits in certain applications. For example, one benefit is the reduction of series resistance, sometimes referred to with the designation of $R_s$. This reduction provides an increase in forward bias current $I_F$, which is favorable as explained above in connection with the higher magnitude curve in the plot relative to the positive voltages in FIG. 3. As another example, it has been observed in connection with the alternative preferred embodiment that parasitic effects are reduced when including both the spike implant and higher-concentration flat profile implant, thereby considerably reducing the undesirable effect of the reverse breakdown operation. In other words, the point at which reverse breakdown current increases in magnitude is improved.

Figure 6:
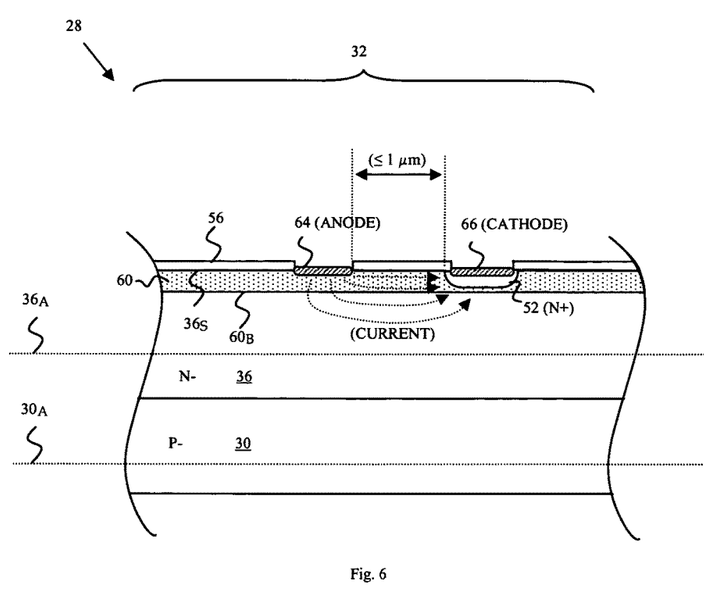
FIG. 6 illustrates a cross-section of an alternative diode per the preferred embodiments.

The preferred embodiment approaches described above may be applied to various Schottky diode interfaces regardless of certain structural differences, and in this regard such approaches may be applied to the diode structure detailed in the above-incorporated patent application Ser. No. 11/174, 190, entitled "Schottky Diode With Minimal Vertical Current Flow." To briefly demonstrate such a structure, FIG. 6 illustrates a cross-section of a diode per that document and that is now described briefly and further modified per the preferred embodiments, while the reader is referred to the other document if additional details are desired. Specifically, FIG. 6 illustrates a semiconductor structure 28 that includes a region 30 that may be a substrate, or alternatively, region 30 may be an isolated well that is disposed over a separate and underlying substrate that is not specifically shown in the Figure. In the present example, region 30 is a lightly-doped P type material (hence, "P−"), with therefore a doping profile concentration on the order of $10^{16}/cm^3$ or less. The majority axis of region 30 is shown by way of a dashed line as $30_A$ and in the illustration is generally lateral or horizontal. The direction of axis $30_A$ provides a reference direction and dimension for sake of discussion later in terms of the operation and flow of current for a Schottky diode that is formed in an active region 32 (sometimes referred to as a device region) of structure 28. A semiconductor layer 36, as may be formed as a well by way of example, is formed above region 30, and region 30 has a majority axis $36_A$ that is parallel to axis $30_A$. In the present example, semiconductor layer 36 is a lightly-doped N type material, shown therefore with an "N−" designation. A source/drain region 52, preferably of the same conductivity type but having a greater dopant concentration, is formed in N well 36, thereby providing an N+region having a concentration on the order of $10^{19}$ to $10^{21}/cm^3$ or greater. The implant used to form region 52 is preferably by way of a high-dose ion implantation of antimony, arsenic or phosphorus species to form NMOS regions that are typically referred to as source/drain regions because at the same time actual transistor source/drain regions may be formed, although such versions with respect to a transistor are not shown so as to simplify the discussion. Further, the present example also applies to an alternative embodiment that implements complementary conductivity type structures (i.e., substituting N for P and vice versa in active region 32); in this opposite case, then the implanted ions may be of boron to form PMOS source/drain regions. Returning to the present example, therefore, where layer 36 is N type, then antimony, arsenic or phosphorus may be used to form source/drain region 52; technically this region does not serve as either a source or drain with respect to a transistor, yet the source/drain terminology is maintained since it is formed using the same process and at the same time as may be source/drain regions elsewhere with respect to the same semiconductor layer 36. An insulating layer 56 is formed with portions along surface $36_S$ of layer 36, and with additional processing steps a metal layer is deposited over the entirety of the device and reacted (i.e., silicidization), with removal of the unreacted metal leaving silicide regions 64 and 66 in contact with regions 36 and 52, respectively. Lastly, also in connection with the structures shown in FIG. 6, a spike implant, and optionally a high dosage flat dopant profile implant, are preferably performed consistent with the teachings of earlier figures. Thus, a spike region 60 is shown where a non-uniform concentration of dopants has been implanted and where a measure of the concentration in that region (or volume) at different points is higher than below the border $60_B$ of that region, where a relatively uniform and lower distribution of ions is located.

Having described the construction of structure 28 in FIG. 6, attention is now directed to the operation of a Schottky diode. Note that a metal to lightly-doped semiconductor interface exists between the conductor silicide region 64 and the lightly-doped N type layer 36 beneath it. Thus, in operation, this interface performs akin to a PN junction, so a positive forward bias may be applied to metal-silicide region 64 relative to the conductor metal silicide region 66. With this bias, current flows from metal-silicide region 64 to layer 36, as shown in FIG. 6 by the generally lateral (or horizontal) dashed arrows in layer 36. Thus, with respect to this current flow, at least a majority of the current flow is parallel to majority axis $30_A$ and majority axis $36_A$. In other words, in FIG. 6, there is not a large amount of current that is generally vertical and, thus, perpendicular to these majority axes, whereas by way of contrast in the diode of FIG. 1b there is a considerable vertical component of current flow through sinker 20. Further, metal-silicide region 64 operates as the diode anode, providing the inward location of current flow. Also, the relatively lower potential at metal-silicide region 66 is connected through an ohmic connection to the relatively high doping of source/drain region 52, which further connects that potential to layer 36; thus, the current flow continues from layer 36 laterally to source/drain region 52 and then to metal silicide region 66, thereby permitting the latter to be referred to as the diode cathode. In any event, during this operation, however, the spike dopant implant into layer 36, either alone or in combination with a separate flat dopant profile implant into layer 36, also serve to increase the Is of the device while not permitting an unacceptable amount of reverse breakdown current.

From the above, it may be appreciated that the preferred embodiments provide a Schottky diode formed in part with a spike implant. Various alternatives have been provided according to preferred embodiments, and still others may be ascertained by one skilled in the art. Indeed, certain of the process parameters described herein may be adjusted by one skilled in the art, steps may be added or re-arranged in order, and substitutions in some materials also may be made. Further and as shown by examples, the preferred embodiment diode may be constructed with a P type or N type semiconductor material in the metal to lightly-doped semiconductor interface of the Schottky diode. Thus, in the case of FIGS. 1a and 1b, the diode conductive path could be through N type material rather than P type material, and in the case of FIG. 6, the diode conductive path could be through P type material rather than N type material. Indeed, based on considerations such as barrier height, one or the other of these types may be selected, such as in a preferable implementation which may include the use of one or more Schottky diode types in a radio frequency identification ("RFID") device. Moreover, a beneficial barrier height may be achieved while still using a same metal as is used for other devices (e.g., transistors) that are constructed during the same method flow as the diode(s). Given the preceding, therefore, one skilled in the art should further appreciate that while the present embodiments have been described in detail, various substitutions, modifications or alterations could be made to the descriptions set forth above without departing from the inventive scope, as is defined by the following claims.

The invention claimed is:

1. A method for making a semiconductor device including a Schottky diode in a process flow having steps for the formation of a titanium, cobalt or nickel silicide, the method comprising:
providing a lightly doped P type substrate;
forming an N type buried layer within the P type substrate and spaced below a surface of the P type substrate;
forming N type regions from the surface to the N type buried layer, to define an overlying region of the P type substrate above the N type buried layer;
forming a heavily doped P type buried layer above and in contact with the N-type buried layer, spaced below the surface within the overlying region;
forming a heavily doped P type sinker region from the surface to the P type buried layer;
performing a P type dopant implant into the overlying region, to form a surface implant region at the surface, the surface implant region having a spike dopant concentration that is at least ten times greater near the surface than a P type dopant concentration of the lightly doped P type substrate, wherein the P type dopant implant is performed as a blanket implant into the overlying region without a photoresist mask; and
using the process flow steps, forming titanium, cobalt or nickel silicide regions that define a diode anode in contact with the P type sinker region at the surface and define a diode cathode in direct contact with the surface implant region at the surface at a position above the P type buried layer laterally spaced from the diode anode and the P type sinker region, wherein the spike dopant concentration of the surface implant region decreases with depth from a top surface of the surface implant region to a bottom border of the surface implant region including directly under the diode cathode.

2. The method of claim 1, wherein the process flow also has steps for adjusting a threshold voltage of a transistor or for forming an LDD diffusion for a transistor; and the P type dopant implant is performed using the step for adjusting the threshold voltage or the step for forming the LDD diffusion.

3. The method of claim 1, wherein performing the P type dopant implant comprises performing a rapid thermal process whereby P type ions are implanted and then heated for 15 second to one minute at a temperature of 850-1000° C.

4. The method of claim 1, wherein an increase in P type dopant concentration of the P type substrate from performing the P type dopant implant is within a depth of 0.2 microns from the surface.

5. A method for fabricating a semiconductor device comprising:
providing a lightly doped P type substrate; and
forming a Schottky diode by:
forming an N type buried layer within the P type substrate and spaced below a surface of the P type substrate;
forming N type regions from the surface to ends of the N type buried layer, to define an overlying region of the P type substrate above the N type buried layer;
forming a heavily doped P type buried layer above and in contact with the N-type buried layer, spaced below the surface within the overlying region;
forming a heavily doped P type sinker region from the surface to the P type buried layer;
performing a P type dopant implant into the overlying region to form a surface implant region at the surface, wherein the P type dopant implant is performed as a blanket implant into the overlying region without a photoresist mask; and
forming silicide regions that define a diode anode in contact with the P type sinker region at the surface and define a diode cathode in direct contact with the surface implant region at the surface at a position above the P type buried layer laterally spaced from the diode anode and the P type sinker region, wherein a metal used to form the silicide regions is selected from the group consisting of titanium, cobalt, and nickel.

6. The method of claim 5, further comprising adjusting a threshold voltage of a transistor, wherein the P type dopant implant is performed using the step for adjusting the threshold voltage.

7. The method of claim 5, wherein performing the P type dopant implant comprises performing a rapid thermal process whereby P type ions are implanted and then heated for 15 second to one minute at a temperature of 850-1000° C.

8. The method of claim 5, wherein an increase in P type dopant concentration of the P type substrate from performing the P type dopant implant is within a depth of 0.2 microns from the surface.

9. A method for fabricating a semiconductor device comprising:
forming a Schottky diode by:
forming an N type buried layer within a P type substrate and spaced below a surface of the P type substrate;
forming N type regions from the surface to ends of the N type buried layer, to define an overlying region of the P type substrate above the N type buried layer;
forming a heavily doped P type buried layer above and in contact with the N-type buried layer, spaced below the surface within the overlying region;
forming a heavily doped P type sinker region from the surface to the P type buried layer;
performing a P type dopant implant into the overlying region across an entire width of the overlying region to form a surface implant region at the surface that extends at least from the heavily doped P type sinker region to the N type regions; and
forming silicide regions that define a diode anode in contact with the heavily doped P type sinker region at the surface and define a diode cathode in direct contact with the surface implant region at the surface at a position above the P type buried layer laterally spaced from the diode anode and the heavily doped P type sinker region.

10. The method of claim 9, wherein a metal used to form the silicide regions is selected from the group consisting of titanium, cobalt, and nickel.

11. The method of claim 9, further comprising adjusting a threshold voltage of a transistor and the P type dopant implant is performed using the step for adjusting the threshold voltage.

12. The method of claim 9, further comprising forming an LDD diffusion for a transistor, wherein the P type dopant implant is performed using the step forming the LDD diffusion.

13. The method of claim 9, wherein performing the P type dopant implant comprises performing a rapid thermal process whereby P type ions are implanted and then heated for 15 second to one minute at a temperature of 850-1000° C.

14. The method of claim 9, wherein an increase in P type dopant concentration of the P type substrate from performing the P type dopant implant is within a depth of 0.2 microns from the surface.

* * * * *